United States Patent
Schwaiger

(10) Patent No.: US 9,502,867 B2
(45) Date of Patent: Nov. 22, 2016

(54) INTEGRATED COOLING SYSTEM

(75) Inventor: Arnold Schwaiger, Regensburg (DE)

(73) Assignee: Starkstrom-Geratebau GmbH, Regensburg (DE)

( * ) Notice: Subject to any disclaimer, the term of this patent is extended or adjusted under 35 U.S.C. 154(b) by 603 days.

(21) Appl. No.: 13/824,819

(22) PCT Filed: Sep. 16, 2011

(86) PCT No.: PCT/EP2011/066087
§ 371 (c)(1),
(2), (4) Date: Jun. 10, 2013

(87) PCT Pub. No.: WO2012/035136
PCT Pub. Date: Mar. 22, 2012

(65) Prior Publication Data
US 2013/0329343 A1    Dec. 12, 2013

(30) Foreign Application Priority Data
Sep. 16, 2010  (EP) ..................... 10177054

(51) Int. Cl.
*H02B 1/56* (2006.01)
*H01F 27/10* (2006.01)
(Continued)

(52) U.S. Cl.
CPC ............... *H02B 1/56* (2013.01); *H01F 27/10* (2013.01); *H05K 7/20927* (2013.01); *H01F 2027/408* (2013.01)

(58) Field of Classification Search
CPC ................ G06F 1/206; G06F 1/20; G05D 23/1917; H05K 7/20836; H05K
(Continued)

(56) References Cited

U.S. PATENT DOCUMENTS 4,030,316 A    6/1977 Aronson
2004/0158428 A1    8/2004 Byrd et al.
(Continued)

FOREIGN PATENT DOCUMENTS

DE    40 36 072    5/1992
JP    11-063665    3/1999
(Continued)

OTHER PUBLICATIONS

European Office Action dated Jul. 29, 2014 in EP 10 177 053.4, 6 pages.
(Continued)

*Primary Examiner* — Robert Fennema
*Assistant Examiner* — Jigneshkumar Patel
(74) *Attorney, Agent, or Firm* — Nixon & Vanderhye P.C.

(57) ABSTRACT

The present invention relates to an integrated cooling system 10 for a power station 14 comprising a transformer 16 and at least one of a generator 18 and/or a rectifier 20. The integrated cooling system 10 comprises a cooler 28 for reduction of an operative temperature of a cooling fluid circulating in the integrated cooling system 10. A pipe system 12 couples the cooler 28 to the transformer 16 and the generator 18 and/or the rectifier 20 in the power station 14. Further, a controller 32 of the integrated cooling system executes the cooling control of the integrated cooling system 10 according to operative temperatures of the transformer 16 and the generator 18 and/or the rectifier 20 in the power station 14. The provision of a common cooler for the different components of the power station 14 allows for a reduced installation space, reduced costs, and lower energy consumption for power station heating.

11 Claims, 5 Drawing Sheets

(51) Int. Cl.
*H01F 27/40* (2006.01)
*H05K 7/20* (2006.01)

(58) Field of Classification Search
CPC .............. 7/20209;H05K 7/20927; H02B 1/56; H01F 27/10; H01F 2027/408
USPC ........................................................ 700/300
See application file for complete search history.

(56) References Cited

U.S. PATENT DOCUMENTS

| | | | |
|---|---|---|---|
| 2005/0122684 A1 | 6/2005 | Chu et al. | |
| 2005/0235671 A1 | 10/2005 | Belady et al. | |
| 2008/0018181 A1 | 1/2008 | Neal | |
| 2008/0178590 A1* | 7/2008 | Chillar et al. .................. | 60/597 |
| 2010/0085708 A1 | 4/2010 | Martin et al. | |
| 2010/0156117 A1* | 6/2010 | Allen ........................... | 290/40 C |
| 2010/0279435 A1* | 11/2010 | Xu et al. .......................... | 438/5 |

FOREIGN PATENT DOCUMENTS

| | | |
|---|---|---|
| JP | 11 063665 | 5/1999 |
| JP | 2007-093120 | 4/2007 |
| JP | 2007 093120 | 12/2007 |
| JP | 2009/078229 | 4/2009 |
| WO | WO 2006/057516 | 6/2006 |

OTHER PUBLICATIONS

European Office Action dated Jul. 29, 2014 in EP 11 757 622.3, 5 pages.
European Examination Report dated Jan. 7, 2014 in EP Application No. 11 757 622.3.
International Search Report for PCT/EP2011/066087 mailed Feb. 3, 2012.
IEEE Transactions on Instrumentation and Measurement, vol. 50, No. 5, Jan. 1, 2001, p. 1138.
Chinese First Office Action issued May 6, 2015 in CN 201180052114.5 and English translation, 15 pages.
English translation of Japanese Office Action issued Jun. 2, 2015 in JP 2013-528683, 3 pages.
European Office Action issued Mar. 26, 2015 in EP 10 177 053.4, 6 pages.
European Office Action issued Mar. 26, 2015 in EP 11 757 622.3, 6 pages.
European Invitation dated Nov. 18, 2015 issued in EP 11757622.3, 3 pages.
European Invitation dated Nov. 19, 2015 issued in EP 10177054.3, 3 pages.
English translation of Chinese Second Office Action dated Jan. 28, 2016 issued in CN 201180052114.5, 9 pages.

* cited by examiner

INTEGRATED COOLING SYSTEM

This application is the U.S. national phase of International Application No. PCT/EP2011/066087 filed 16 Sep. 2011 which designated the U.S. and claims priority to EP 10177054.3 filed 16 Sep. 2010, the entire contents of each of which are hereby incorporated by reference.

FIELD OF INVENTION

The present invention relates to an integrated cooling system for a power station, and in particular to an integrated cooling system for a power station comprising a transformer in combination with a generator and/or a rectifier.

BACKGROUND ART

In US 2010/0085708 A1, there is described an uninterruptible power supply UPS that may include direct cooling for various components of the UPS that generate heat. The direct cooling may be part of a cooling system that directs the generated heat to the ambient environment external to the room or building housing the UPS such that the heat load of the UPS places a minimal or zero load on the air-conditioning system for the room within which the UPS is located. The cooling system can utilize multiple cooling loops to transfer the heat from the heat-generating components of the UPS to the ambient environment.

In US 2004/0158428 A1, there is described a portable auxiliary cooling system for cooling electrical power transformers is provided with an intelligent controller that is programmable for functioning in a plurality of different operational modes. A plurality of sensors monitor cooling system equipment operation, transformer top oil temperature and transformer current. The cooling system controller includes a user-interface panel, a modem and/or other digital communications circuitry, data storage memory and a computer or microprocessor that performs real-time heat removal rate computations and automatically controls heat pump and fan operation in response to the computed results. System performance data, sensor readings and alarm condition indications are indicated on a user-interface panel and may also be provided to a remote station or operator using conventional digital communication facilities.

Typically, power stations and solar stations comprise different components such as a transformer for coupling the power station to a power network, a generator for transforming mechanical energy derived from, e.g., wind energy or a water flow into electrical energy, and/or a rectifier for controlling the frequency of generated power signals prior to forwarding thereof to the power network.

During operation of the power station each functional unit of the power station is cooled so as to avoid any over heating of, e.g., the transformer, the generator or the rectifier and related damage of the equipment. However, each such component may be provided by different vendors and therefore uses its own cooling equipment.

Therefore, cooling equipment of the power station becomes bulky which is a great disadvantage, e.g., for power stations operated within wind mills which become more and more popular in view environmental protection requirements.

Also, during operation of the power station some functional units of the power station may generate heat and therefore need cooling while others, e.g., during system start may need a heating. As different functional units in the power station are cooled and heated independently from each other there is a waste of energy as discharged heat is not re-used for heating purposes.

Also, the provision of multiple cooling systems through different vendors providing the transformer, the generator and the rectifier leads to plurality of cooling equipments which is highly cost inefficient.

SUMMARY OF INVENTION

In view of the above, an object of the present invention is to increase efficiency in a power station cooling system.

According to a first aspect of the present invention this object is achieved by an integrated cooling system for a power station comprising a transformer and at least one of a generator and a rectifier which has the features of claim 1. The integrated cooling system comprises at least one cooler configured to reduce an operative temperature of a cooling fluid circulating in the integrated cooling system and the power station through operation of at least one cooling pump, a pipe system configured to couple the at least one cooler to the transformer and the at least one of the generator and rectifier in the power station, and a controller configured to execute the cooling control of the integrated cooling system as a function of at least one operative state of the transformer and the at least one of the generator and rectifier in the power station.

According to a second aspect of the present invention this object is also achieved by a method of controlling an integrated cooling system for a power station comprising a transformer and at least one of a generator and a rectifier, wherein the integrated cooling system comprises at least one cooler configured to reduce an operative temperature of a cooling fluid circulating in the integrated cooling system and the power station through operation of at least one cooling pump and a pipe system configured to couple the at least one cooler to the transformer and the at least one generator and rectifier in the power station. The method comprises features of claim 7.

DESCRIPTION OF DRAWING

In the following preferred embodiments of the present invention will be described with reference to the drawing in which.

DESCRIPTION OF PREFERRED EMBODIMENTS

Figure 1:
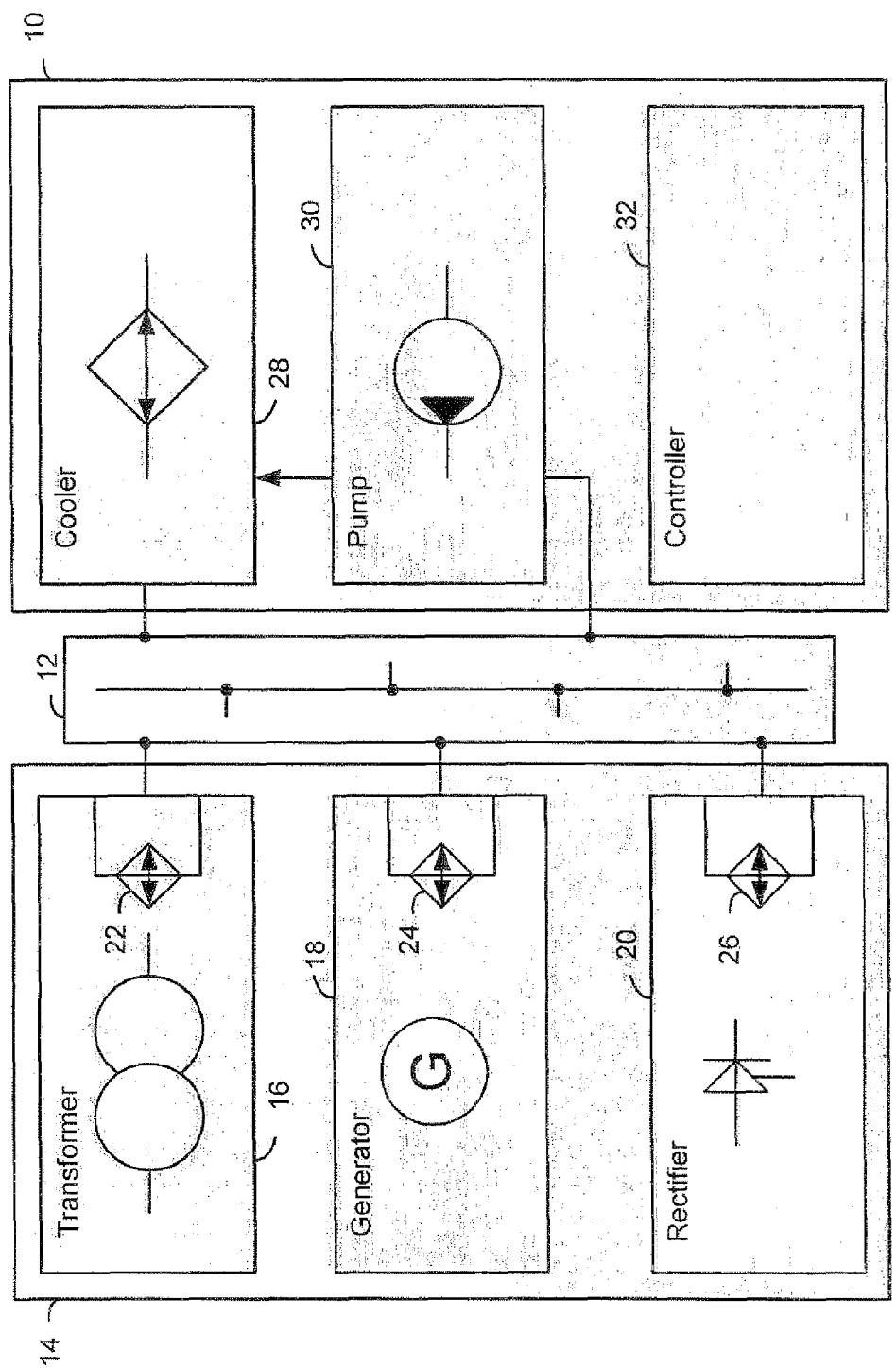
FIG. 1 shows an integrated cooling system according to the present invention being connected to a power station through a pipe system.

In the following preferred embodiments of the present invention will be described with reference to the drawing.

Here it should be noted that as far as different functionalities of the integrated cooling systems are described these may be implemented in hardware, in software or a combination thereof.

FIG. 1 shows an integrated cooling system 10 according to the present invention.

As shown in FIG. 1, the integrated cooling system 10 is connected through a pipe system 12 to a power station 14.

As shown in FIG. 1, the power station 12 comprises a transformer 16 and at least one of a generator 18 and a rectifier 20. In other words, in the power station 14 there is operated a combination of the transformer 16 and the generator 18, or a combination of the transformer 16 and the rectifier 20, or a combination of the transformer 16, the generator 18, and the rectifier 20.

As shown in FIG. 1, the transformer 16 may be provided with a transformer cooler 22, the generator may be provided with a generator cooler 24, and the rectifier may be provided with a rectifier cooler 26.

Operatively, the transformer cooler 22, the generator cooler 24, and the rectifier cooler 26 are operated independently from each other as long as the heat generation in the transformer 16, the generator 18, and the rectifier 20 does exceed predetermined limits.

As shown in FIG. 1, the integrated cooling system 10 comprises a cooler 28, e.g., a passive cooler or a heat exchanger, a cooling pump 30, and a controller 32. Although not shown in FIG. 1, in the integrated cooling system 10 according to the present invention there may also be provided two or more coolers or cooling pumps depending on the cooling requirements and the size of the power station 14.

Operatively, the cooler 28 is adapted to reduce an operative temperature of a cooling fluid, e.g., water, circulating in the integrated cooling system 10, the pipe system 12, and the power station 14 through operation of the cooling pump 30.

Further operatively, the controller 32 is adapted to execute the cooling control of the integrated cooling system 10 as a function of operative states, e.g., a temperature, of the transformer 16, of the generator 18 and/or the rectifier 20 in the power station 14. Here, an operative state may be any other suitable characteristic indicating that a change in operation, e.g., start or stop of the cooling pump 30, start or stop of the cooler 28 etc. is necessary.

As shown in FIG. 1, the pipe system 12 is adapted to couple the at least one cooler 28 to the transformer 16, the generator 18 and/or the rectifier 20 in the power station 14. Therefore, depending on the configuration of the power station 14 the pipe system 12 is adapted to couple the cooler 28 to the transformer 16 and the generator 18, or to couple the cooler 28 to the transformer 16 and the rectifier 20, or to couple the cooler 28 to the transformer 16, the generator 18, and the rectifier 20.

In the following, more details of the integrated cooling system 10 according to the present invention will be explained with respect to FIGS. 2 to 6.

Figure 2:
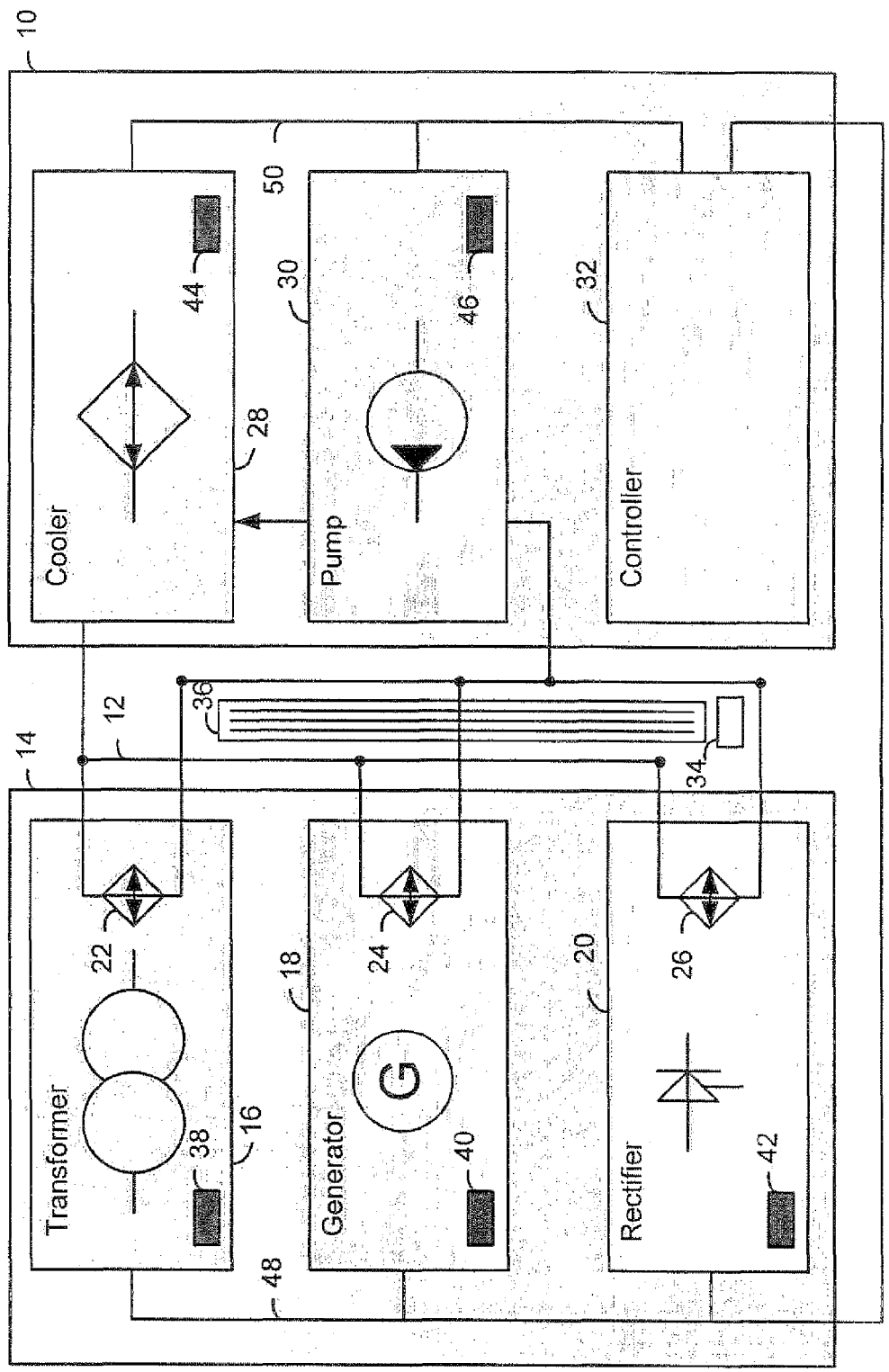
FIG. 2 shows a further detailed schematic diagram of the integrated cooling system shown in FIG. 1 being connected to the power station through a pipe system having parallel topology.

FIG. 2 shows a further detailed schematic diagram of the integrated cooling system 10, the pipe system 12, and the power station 14 shown in FIG. 1.

As shown in FIG. 2, the pipe system 12 connecting the integrated cooling system 10 to the power station 14 has a parallel topology. Also, the pipe system is provided with at least one pipe system temperature sensor 34 and a heater 36.

Here, operatively the controller 32 of the integrated cooling system is adapted to activate the cooler 28 of the integrated cooling system 10 when the temperature measured by the pipe system temperature sensor 34 exceeds related threshold value also referred to as third threshold value in the following.

As shown in FIG. 2, in the power station 14 the transformer is provided with a transformer operative state detector 38 measuring, e.g., a transformer temperature in the core of the transformer 16.

As shown in FIG. 2, in the power station 14 the generator 18 is provided with a generator operative state detector 40 measuring, e.g., the temperature of the stator winding or the rotor winding of the generator 18, a generator torque, a generator load, etc.

As shown in FIG. 2, in the power station 14 the rectifier 20 is provided with a rectifier operative state detector 42 measuring, e.g., a rectifier temperature, a rectifier operative frequency, etc.

As shown in FIG. 2, in the integrated cooling system 10 the cooler 28 is provided with a cooler operative state sensor 44, e.g., a cooler on/off state sensor, a cooler temperature sensor, etc.

As shown in FIG. 2, in the integrated cooling system 10 the cooling pump 30 is provided with a cooling pump operative state sensor 46 measuring, e.g., a cooling pump on/off state, a cooling pump volume per time unit, etc.

As shown in FIG. 2, to connect the various operative state sensors 38 to 46 with the controller 32 of the integrated cooling system there is provided a first connection 48 from the power station 14 to the controller 32 and a second connection 50 from the cooler 28 and the cooling pump 30 to the controller 32.

Further, the first connection 48 and the second connection 50 may be, e.g., a dedicated wiring, a bus connection with addressing option, a bus connection without addressing option, any other appropriate means for establishing communication between the various operative state sensors 38 to 46 and the controller 32.

Operatively, in a no-load operative state of the transformer 16 which may be detected, e.g., by the transformer operative state sensor 38, the controller 32 is adapted to activate the cooling pump 30 when the temperature of the transformer 16, e.g., as measured by the transformer operative state detector 38 exceeds a first threshold value.

In view of this, no-load losses of the transformer 16 will take a share of preheating the other components in the power station 14, e.g., the generator 18 or the rectifier 20, e.g., during a cold start of the power station 14. Thus, the integration of transformer cooling and the heating of the generator 18 and/or the rectifier 20 allows for a reduction of installation space and cost savings for the set up of the overall system.

Further, operatively the controller 32, again in a no-load operative state of the transformer 16, is adapted to activate the transformer cooler 22 when the temperature of the transformer 16 exceeds a second threshold value being larger than the first threshold value. As an alternative the second threshold value may also be equal to or smaller than the first threshold value.

Further, operatively the controller 32 is adapted to shut down operation of the power station 14 when the temperature of the transformer 16 exceeds a warning threshold of.

Further, operatively the controller 32 is adapted to activate the heater 36 of the pipe system 12 when the temperature measured by the pipe system temperature sensor 34 is below a fourth threshold value.

Figure 3:
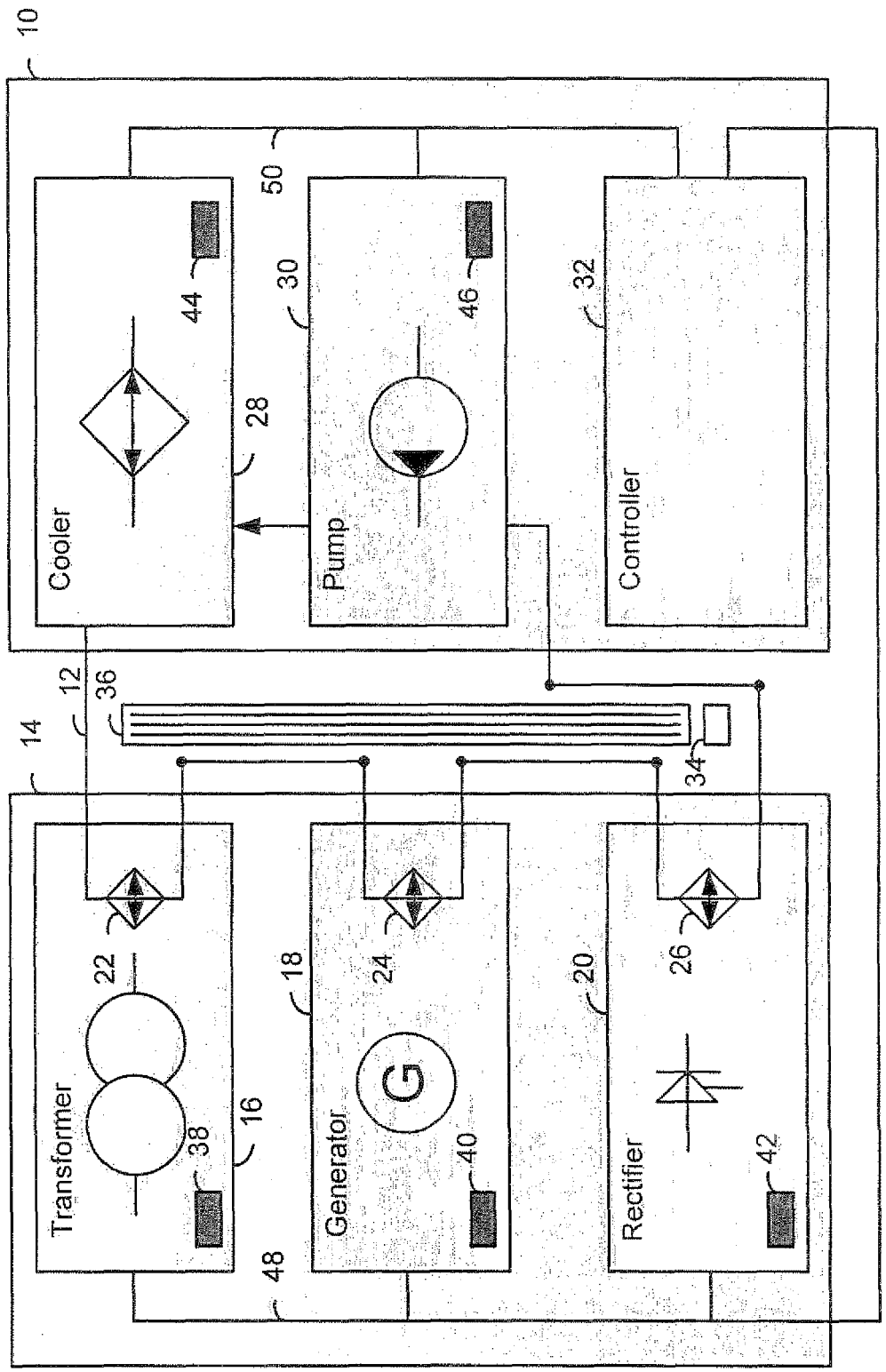
FIG. 3 shows a further detailed schematic diagram of the integrated cooling system shown in FIG. 1 being connected to the power station through a pipe system having serial topology.

FIG. 3 shows a further detailed schematic diagram of the integrated cooling system 10 shown in FIG. 1 being connected to the power station through pipe system in serial topology.

This functional elements being identical to those shown in and explained with respect to FIG. 2 are referenced using the same reference numerals so that a repeated explanation thereof is omitted here.

The difference between the constellation shown in FIGS. 2 and 3 is that the pipe system according to FIG. 2 is a parallel pipe system while the pipe system shown in FIG. 3 connected the different components in series.

In the following details of the operation of the controller 32 of the integrated cooling system will be explained with reference to FIGS. 4 to 6.

Figure 4:
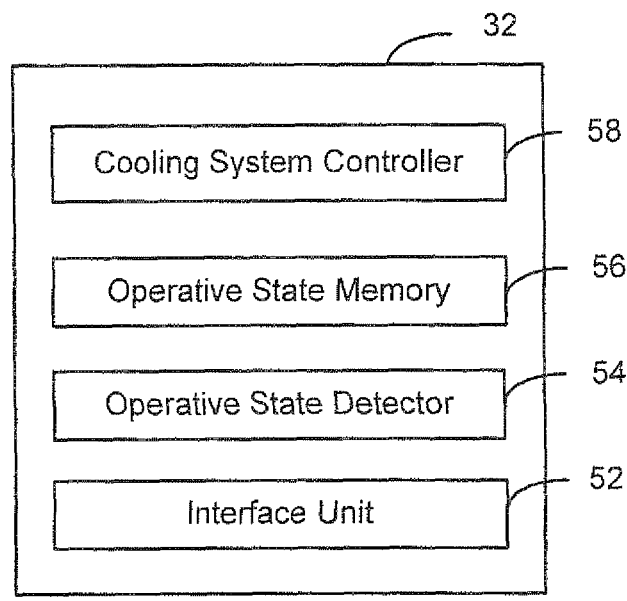
FIG. 4 shows a further detailed schematic diagram of the integrated cooling system controller shown in FIGS. 1 to 3.

FIG. 4 shows a schematic diagram of the integrated cooling system controller 32 shown in FIGS. 1 to 3.

As shown in FIG. 4, the integrated cooling system controller comprises an interface unit 52, an operative state detector 54, an operative state memory 56, and a cooling system controller.

Figure 5:
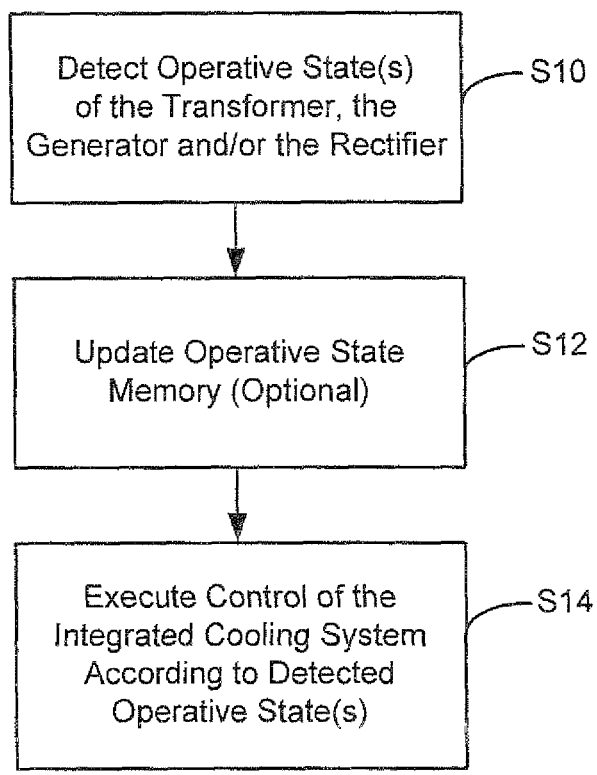
FIG. 5 shows a flowchart of operation for the integrated cooling system controller shown in FIG. 4.

FIG. 5 shows a flowchart of operation for the integrated cooling system controller shown in FIG. 4.

As shown in FIG. 5, in a step S10, executed by the operative state detector 54 and the interface unit 52 shown in FIG. 4, at least one operative state of the transformer 16, the generator 18, and/or the rectifier 20 are detected. Here, the operative state detection of the controller 32 polls the different operative state detectors 38, 40, 42 in the power station 14 and optionally also the operative state detectors 44, 46 in the integrated cooling system 10 through access thereto via the interface unit 52 and the connections 48 and 50.

As shown in FIG. 5, in a step 12 executed by the operative state memory 56 shown in FIG. 4, there is executed an update of the operative state memory 56 according to the detected operative states. Here, it should be noted that for the storage of operative state data any suitable data structure may be used, e.g., in the form of a table, in the form of a state diagram, of as relational data base, etc.

As shown in FIG. 5, in a step S14 executed by the system cooling controller 58 shown in FIG. 4, there is executed a control of the integrated cooling system 10 according to detected operative states of the components of the power station 14 and according to detected operative states of the components of the integrated cooling system 10.

Figure 6:
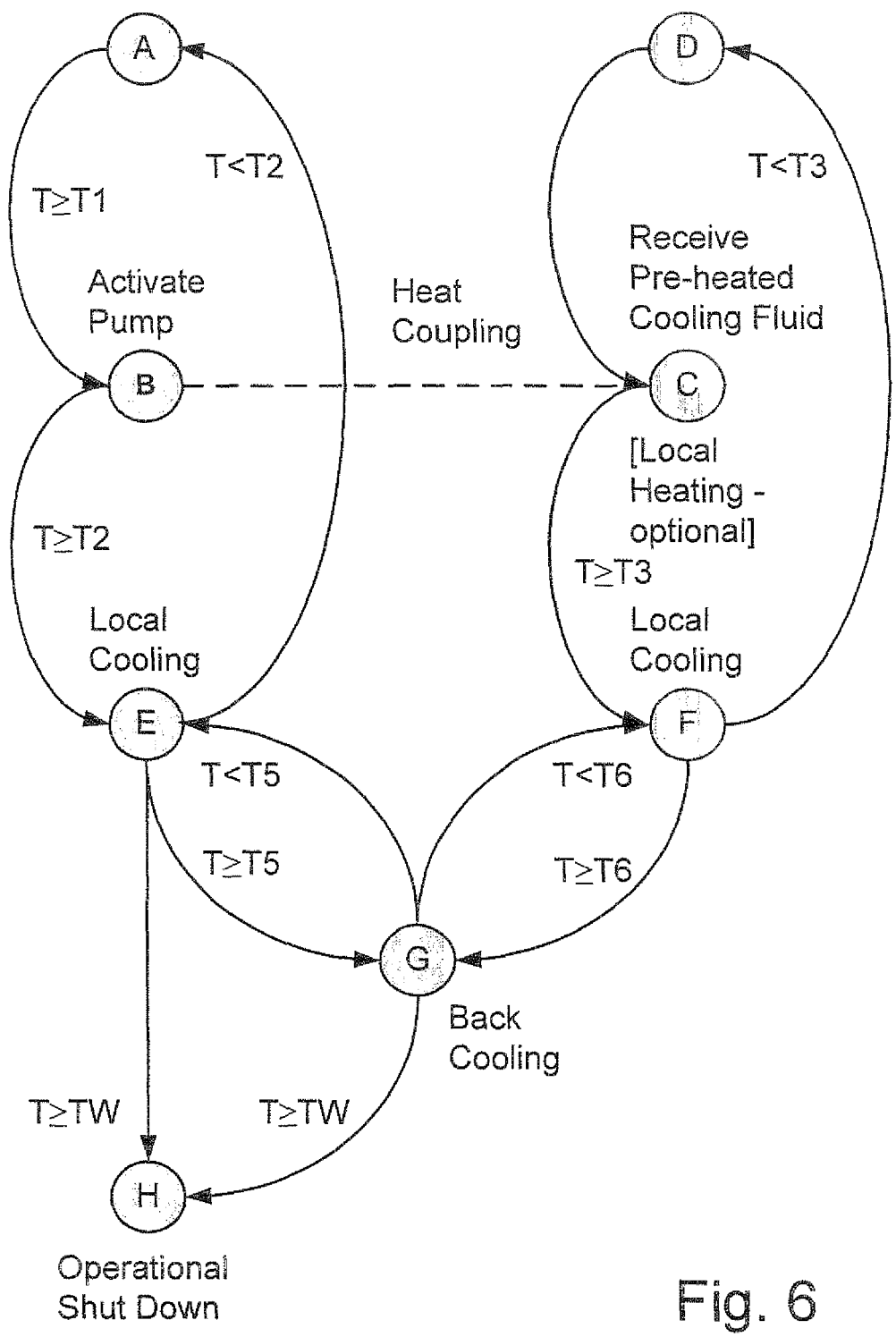
FIG. 6 shows a state diagram representing transitions between operative states of the components of the integrated cooling system and the components of the power system shown in FIGS. 1 to 3.

FIG. 6 shows in more details what the control of the integrated cooling system 10 according to detected operative states means. Heretofore, there is used a so-called state diagram showing different operative states as nodes A to H in the state diagram and the transitions between different states as directed edges in the state diagram.

As shown in FIG. 6, for the execution of the cooling control there are considered operative states of the transformer 16 and the integrated cooling system 10 on the one hand and further of the generator 18, the rectifier 20, and the pipe system 12 on the other hand.

As shown in FIG. 6, a first state A is related to a cold start of the system, i.e., a state where the complete system starts operation. Here, initially the transformer 16 is in a no-load condition and generates heat while the operative temperature increases.

As shown in FIG. 6, eventually the temperature of the transformer will exceed the first threshold T1, see operative state P. According to the present invention it is suggested to then activate the cooling pump 30 of the integrated cooling system 10.

As shown in FIG. 6, assuming an activation of the cooling pump 30 and through heat coupling between the transformer cooler 22, generator cooler 24, and/or rectifier cooler 26 via the pipe system 12, pre-heated cooling fluid will be received at the generator 18 and/or rectifier 20 and accommodated in the pipe system 12, see operative state C. Assuming again a cold start scenario, this also implies a state transition from the off state D of the generator 18 and/or rectifier 20 to the pre-heating state C. Also, it should be noted that optionally the cooling system controller may also activate, e.g., the heater 36 of the pipe system 12 for acceleration of the system start up time or any other supplementary heating system for either the generator and/or the rectifier.

As shown in FIG. 6, eventually all components of the power station 14 and of the integrated cooling system 10 will reach an operative temperature which allows for generation of energy in the power station 14 and coupling of the generated energy to the power network through the transformer 16.

As shown in FIG. 6, the temperature of the transformer 16 may eventually exceed the second threshold T2 implying a transition to state E where the transformer 16 is cooled by the transformer cooler 22, under control of the cooling system controller 58.

As shown in FIG. 6, also the temperature of the generator 18 and/or the rectifier may eventually exceed the third threshold T3 implying a transition to state F where the generator 18 and/or the rectifier 20 are cooled by the generator cooler 24 and/or the rectifier cooler 26, respectively, under control of the cooling system controller 58.

As shown in FIG. 6, depending on the load of the power station 14 the temperature of the transformer 16 may eventually exceed a fifth threshold T5 implying a transition to a state G where the transformer 16 is also cooled by the cooler 28 of the integrated cooling system 10 in addition to the local cooling at the transformer 16 through the transformer cooler 22, again under control of the cooling system controller 58.

As shown in FIG. 6, depending on the load also the temperature of the generator 18 and/or the rectifier may eventually exceed a sixth threshold T6 implying again a transition to the state G where the generator 18 and/or the rectifier 20 are further cooled through operation of the cooler 28 in the integrated cooling system 10, under control of the cooling system controller 58.

As shown in FIG. 6, assuming a defect of the transformer 16, the transformer temperature may eventually exceed a critical warning threshold TW triggering a turn off of the power station 14, see transition from state E or state G to state H. A similar action may occur with respect to the generator 28 and/or the rectifier 20, see transition from state G to state H.

As shown in FIG. 6, assuming a regular operation of the system and a reduction of the system load or a complete turn off of the system finally the operative temperatures of the different components will decrease again implying successive transitions in the operative states such as state G to state E or state F, state E to state A, or state F to state D back to the starting condition of the system.

It should be noted that the integrated cooling system according to the present invention is designed to be operable under various climate conditions prevailing all around the world, e.g., to be operative from a temperature of −40° up to a temperature of +50° C., as an example. Therefore, the person skilled in the art will appropriately select best threshold values according to the climate conditions prevailing for each installation of the integrated cooling system.

It should be also be noted that while above different transitions between different operative states have been described with respect to operative temperatures this it not to be considered as a restriction for the present invention.

E.g., such transitions may also be executed under control of the integrated cooling system controller according to various other operative parameters, e.g., operative frequency of the rectifier, or mechanical load on the generator, etc.

Overall the present invention achieves a very efficient approach to the cooling of the power station 14 where only a single back cooler 28 is used in the integrated cooling system 10 for the common cooling of the different components transformer 16, generator 18, and/or rectifier 20 as provided in the power station 14. This allows for a reduction of installation space and a reduction of costs. Also as discharge heat from the transformer 16 is used for heating the generator 18 and/or the rectifier 20 the energy necessary for the heating of the power station components may be decreased significantly. Also the integrated cooling system may protected against dust, dirt, moisture, or salt existing at different installation sites through appropriate housing enabling all climate installations.

There has been described, according to a first example, an integrated cooling system (10) for a power station (14) comprising a transformer (16) and at least one of a generator (18) and a rectifier (20), comprising at least one cooler (28) adapted to reduce an operative temperature of a cooling fluid circulating in the integrated cooling system (10) through operation of at least one cooling pump (30), a pipe system (12) adapted to couple the at least one cooler (28) to the transformer (16) and the at least one of the generator (18) and rectifier (20) in the power station (14), and a controller (32) adapted to execute the cooling control of the integrated cooling system (10) as a function of at least one operative state of the transformer (16) and the at least one of the generator (18) and rectifier (20) in the power station (14).

According to a second example in the integrated cooling system according to the first example the transformer (16) is preferable provided with a first temperature sensor (38) in the core and the controller (32), in a no-load operative state of the transformer (16), is adapted to activate the at least one cooling pump (30) when the temperature measured by the first temperature sensor (38) exceeds a first threshold value (T1).

According to a third example in the integrated cooling system according to the second example the transformer (16) is preferably provided with a transformer cooler (22), and the controller (32), in a no-load operative state of the transformer (16), is adapted to activate the transformer cooler (22) when the temperature measured by the first temperature sensor (38) exceeds a second threshold value (T2) being larger than the first threshold value (T1).

According to a fourth example in the integrated cooling system according to the first to third examples the controller (32) is adapted to shut down operation of the power station (14) when the temperature measured by the first temperature sensor (38) exceeds a warning threshold (7W).

According to a fifth example in the integrated cooling system according to the first to fourth examples the pipe system (12) is provided with a third temperature sensor (34), and the controller (32) is adapted to activate the at least one cooler (28) of the integrated cooling system (10) when the temperature measured by the third temperature sensor (34) exceeds a third threshold value.

According to a sixth example in the integrated cooling system according to the fifth example the pipe system (12) is provided with at least one heating element (36), and the controller (32) is adapted to activate the at least one heating element (36) when the temperature measured by the third temperature sensor (34) is below a fourth threshold value which is smaller than the third threshold value.

According to a seventh example in the integrated cooling system according to the first to sixth examples the pipe system (12) is adapted to connect the transformer (16), the generator (18), and/or the rectifier (20) of the power station (14) in parallel.

According to an eighth example in the integrated cooling system according to the first to sixth examples the pipe system (12) is adapted to connect the transformer (16), the generator (18), and/or the rectifier (20) of the power station (14) in series.

According to a ninth example in the integrated cooling system according to the first to eighth examples the at least one cooler (28) of the integrated cooling system is a passive cooler.

According to a tenth example there has been described a method of controlling an integrated cooling system (10) for a power station (14) comprising a transformer (16) and at least one of a generator (18) and a rectifier (20), wherein the integrated cooling system (10) comprises at least one cooler (28) adapted to reduce an operative temperature of a cooling fluid circulating in the integrated cooling system (10) through operation of at least one cooling pump (30) and wherein a pipe system (12) adapted to couple the at least one cooler (28) to the transformer (16) and the at least one generator (18) and rectifier (20) in the power station (14), the method comprising the step executing (S14) the cooling control of the integrated cooling system (10) as a function of at least one operative state of the transformer (16) and the at least one of the generator (18) and rectifier (20) in the power station (14).

According to an eleventh example the method according to the tenth example comprises the step measuring the core temperature of the transformer (16) with a first temperature sensor (38) provided in the core of the transformer (16), and activating, in a no-load operative state of the transformer (16), the at least one cooling pump (30) when the temperature measured by the first temperature sensor exceeds a first threshold value (T1).

According to an twelfth example the method according to the eleventh example comprises the step activating, in a no-load operative state of the transformer (16), a transformer cooler (22) of the transformer (16) when a temperature measured by the first temperature sensor (38) exceeds a second threshold value (T2) being larger than the first threshold value (T1).

According to an thirteenth example the methods according to the tenth to twelfth examples comprise the step of shutting down operation of the power station (14) when the temperature measured by the first temperature sensor (38) exceeds a warning threshold (TW).

According to an fourteenth example the methods according to the tenth to thirteenth examples comprise the steps measuring the temperature in the pipe system (12) with at least one third temperature sensor (34), and activating the at least one cooler (28) of the integrated cooling system (10) when the temperature measured by the third temperature sensor (34) exceeds a third threshold value.

According to an fifteenth example the method according to the fourteenth example comprises the step activating the at least one heating element (36) provided in the pipe system (12) when the temperature measured by the third temperature sensor (34) is below a fourth threshold value which is smaller than the third threshold value.

The invention claimed is:

1. A power generation system comprising:
a power station including:
a transformer being provided with a transformer temperature sensor for measuring a transformer temperature,
a transformer cooler,
at least one of a generator with a generator cooler and a rectifier with a rectifier cooler,
an integrated cooling system for cooling of the power station, where the integrated cooling system includes:
a cooling pump configured to circulate cooling fluid in the integrated cooling system, the pipe system, and the power station,
a back cooler configured to reduce an operative temperature of a cooling fluid circulating in the integrated cooling system, the pipe system, and the power station through operation of the cooling pump, and
a controller configured to execute cooling control of the integrated cooling system;
a pipe system including a pipe system temperature sensor, the pipe system being configured to couple in series with the back cooler of the integrated cooling system to the transformer cooler, the generator cooler, and the rectifier cooler; and
wherein the controller, in a cold start of the power station where the complete power generation system starts operation, is configured to activate the cooling pump when the temperature measured by the transformer temperature sensor exceeds a first threshold value so that no-load losses of the transformer preheat at least one of the generator and the rectifier during a cold start of the power station using pre-heated cooling fluid from the transformer cooler received at the generator cooler and/or the rectifier cooler via the pipe system;
wherein the controller, in a first operative state of the transformer, is configured to activate the transformer cooler when the temperature measured by the transformer temperature sensor exceeds a second threshold value larger than the first threshold value for local cooling of the transformer without activation of the back cooler; and
wherein the controller, in a second operative state, is configured to activate the back cooler when a temperature measured by the transformer temperature sensor exceeds a third threshold value that is larger than the second threshold value to provide additional back cooling of the transformer in addition to the local cooling of the transformer.

2. The power generation system according to claim 1, wherein the controller is configured to activate the generator cooler and/or the rectifier cooler when a temperature of the generator and/or the rectifier exceeds a fourth threshold value.

3. The power generation system according to claim 1, wherein the controller is configured to shut down operation of the power station when the temperature measured by the transformer temperature sensor exceeds a warning threshold.

4. The power generation system according to claim 2, wherein:
the pipe system is provided with a heating element and a pipe system temperature sensor; and
the controller is configured to activate the heating element when the temperature measured by the pipe system temperature sensor is below a fifth threshold value which is smaller than the third threshold value.

5. The power generation system according to claim 1, wherein the controller is configured to activate the back cooler when a temperature of the generator and/or rectifier exceeds a sixth threshold value.

6. The power generation system according to claim 1, wherein at least one back cooler of the integrated cooling system is a passive cooler.

7. A method of controlling a power generation system including a power station having a transformer being provided with a transformer temperature sensor that measures a transformer temperature, a transformer cooler, and at least one of a generator with a generator cooler and a rectifier with a rectifier cooler; an integrated cooling system having a cooling pump that circulates cooling fluid in the integrated cooling system, the pipe system, and the power station, a back cooler that reduces an operative temperature of a cooling fluid circulating in the integrated cooling system through operation of the cooling pump, and a controller that executes cooling control of the integrated cooling system; and a pipe system including a pipe temperature system sensor and coupling the back cooler to the transformer cooler, the generator cooler, and the rectifier cooler, the method comprising:
activating, in a cold start of the power station where the complete power generation system starts operation, the cooling pump when the temperature measured by the transformer temperature sensor exceeds a first threshold value such that no-load losses of the transformer preheat at least one of the generator and the rectifier using pre-heated cooling fluid from the transformer cooler received at the generator cooler and/or the rectifier cooler via the pipe system;
activating, in the first operative state of the transformer, the transformer cooler when the temperature measured by the transformer temperature sensor exceeds a second threshold value larger than the first threshold value for local cooling of the transformer without cooling through the back cooler; and
activating, in a second operative state, the back cooler when the temperature measured by the transformer temperature sensor exceeds a third threshold larger than the second threshold value for additional back cooling of the transformer in addition to the local cooling.

8. The method according to claim 7, further comprising activating the generator cooler and/or the rectifier cooler when a temperature of the generator and/or rectifier exceeds a fourth threshold value.

9. The method according to claim 7, further comprising shutting down operation of the power station when the temperature measured by the transformer temperature sensor exceeds a warning threshold.

10. The method according to claim 7, further comprising:
activating a heating element in the pipe system when the temperature measured by the pipe system temperature sensor is below a fifth threshold value which is smaller than the fourth threshold value.

11. The method according to claim 7, further comprising activating the back cooler when a temperature of the generator and/or rectifier exceeds a sixth threshold value.

* * * * *